United States Patent Office 3,703,386
Patented Nov. 21, 1972

3,703,386

NONFLOW SOLDER-STOP GLASSES COMPRISING LEAD-ZINC BORATE AND CERAMIC

Raymond Louis Dietz, Toledo, Ohio, assignor to Owens-Illinois, Inc.

No Drawing. Filed Oct. 27, 1970, Ser. No. 84,530
Int. Cl. C04b *33/00*; B23k *31/02*
U.S. Cl. 106—39 R 5 Claims

ABSTRACT OF THE DISCLOSURE

By the addition of the requisite amount of a powdered ceramic to a glass composition adapted for printing upon a selected portion of a conductor within a microelectronic component, the printed glass composition, when fired, is found to form an excellent solder stop (i.e. mask) in that its flow properties at its "firing temperature" are sufficiently retarded for good edge resolution despite multiple refirings that may occur during the formulation of the entire microelectronic component.

This invention relates to glass compositions and glass coatings made therefrom. More particularly, this invention relates to non-flowable glasses which may be used in microelectronic components particularly as solder stops.

The need for precise line resolution of printed microelectronic circuit is well known in the microelectronics industry. In addition to precise line resolution of the actual circuitry, it is also known that the encapsulating and/or dielectric components must also be formed within certain tolerable dimensional limits, which because of the minuteness of the system, are often in and of themselves, quite precise. Among such types of components which are required to be within relatively critical dimensional limits are those components formed of glass and used as, for example, sealing members, masking members (e.g. solder stops), insulating dielectrics with via-holes, and the like in a microelectronic assembly.

For example, in the well-known microelectronic subassembly known as a silicon chip semiconductor, there has recently been developed several face bonded designs such as "flip-chip," "LID," and the like which improve the production of the system by materially simplifying the technique of soldering the electrical contacts of the semiconductor subassembly to the conductors of the system. In such designs, however, it is usually necessary to mask a portion of the conductors with a glass coating in order to limit the soldered area and prevent undue spreading of the solder onto undesired portions of the conductors and/or other portions of the system. Such glass compositions are most conveniently applied to the areas to be masked in paste form and are then heated to the "firing temperature" to form a glass mask or solder stop.

As used herein, the term "firing temperature" means the temperature of the glass component portion of the paste at which the viscosity of the glass component portion is approximately $10^4$ poises.

By the very nature of the manner in which microelectronic systems are formed, the above-described glass components are often subjected to one or more refirings, or other subsequent high temperature heat exposures, as for example when other component parts of the assemblies are formed and/or bonded thereto. As stated, these glass components, and especially if such components are masks, must maintain their dimensions within certain tolerable limits during these firings or other subsequent high temperature exposures in order to serve as precise and effective components within the system. If, for example, the glass component is a solder stop, or mask, and it softens and flows appreciably during firing, refiring, or other subsequent high temperature exposures experienced during the manufacturing process of the assembly, insufficient conductor area may remain to form a sufficiently strong bond with the component later soldered thereto. It is therefore evident that undue flow of a glass component at subsequent manufacturing temperatures represents a serious problem in the art.

Generally speaking, the art has sought to overcome the problem of glass flow by using either (1) a carefully and specially developed vitreous glass whose flow properties are inherently small, or (2) a crystallizable glass which devitrifies in situ during its firing (formation) and, thus, by physical change due to a certain percentage of crystals being present in the amorphous glass structure, will not flow when later heated.

While these prior art solutions have achieved a certain modicum of success, they have many drawbacks attendant therewith. For example, specialized vitreous glasses meeting the desired flow requirements must be formulated within critical composition ranges and, thus, are not always sufficiently adaptable to meet the various characteristics of different environments. In addition, and by definition, the vitreous glasses cannot withstand refiring at their firing temperatures without flow occurring. While the crystallizable glasses generally eliminate this problem of refiring flow, they suffer from a critical need to maintain glass composition, degree of crystallization, processing parameters, and the like within very close limits in order to obtain a final structure having a sufficient amount of crystals to prevent flow and, at the same time, a sufficiently high liquidus temperature so that, upon reheating, the structure does not revert to a vitreous flowable material.

From the above, it is apparent that the art is in need of a new non-flowable glass system for microelectronic assemblies. More particularly, the art is in need of a glass system which will not flow to any substantial extent during firing, refiring or other subsequent reheating (i.e. high temperatures experienced), when used as a component, and especially as a mask or solder stop, in a microelectronic assembly. It is also apparent that such a new nonflowable glass system should overcome the problems arising from the use of the vitreous and crystallizable prior art glasses hereinabove discussed.

This invention fulfills the above-described needs in the art by providing substantially non-flowable glass systems and compositions from which such systems can be readily formulated. Generally speaking, the compositions contemplated by this invention are comprised of (1) a glass binder otherwise acceptable for use in a microelectronic assembly, except for the fact that it will flow to a substantial degree upon firing or being subsequently subjected to other temperature exposures by which the assembly is formed and (2) a sufficient amount of a powdered ceramic to prevent any substantial amount of flow of the glass binder when subjected to the aforementioned temperature exposures.

The glass binders contemplated for use in the compositions of this invention may include, as stated, any glass which is otherwise useful because of its requisite low firing temperature, binding ability, thermal coefficient of expansion, ability to form a printing paste, etc. in microelectronic assemblies, but which flows too much either during, for example, firing, refiring (i.e. firing of later assembled components) or other subsequent high temperature exposures to be acceptable for use. The glasses contemplated, while usually crystallizable by firing, may in some instances be vitreous and non-crystallizable. Preferably, however, the glass binders will partially crystallize when they are fired from paste form into a glass component, since such crystallinity aids in retarding flow. Generally, the glass compositions contemplated all have a fiber softening temperature (e.g. temperature at which the viscosity of the glass is $10^{7.65}$ poises) of less than about 700° C., or a firing temperature of less than about 750° C.

Examples of glass binders useful for the purposes of this invention include fritted glasses of the lead-zinc-borate type and the lead borosilicate type. Examples of lead borosilicate glass compositions useful as binders in this invention may be found in U.S. Pats. Nos. 3,088,833; 3,088,834; and 3,088,835, the disclosures of which are incorporated herein by reference.

A particularly preferred glass binder for the purposes of this invention, and especially when the glass component formed is a solder stop, is a fritted glass comprised of, by weight, about 30–40% PbO; about 30–40% $B_2O_3$; about 25–30% ZnO and about 0–5% CuO. An especially preferred glass binder for solder stop purposes within the above ranges comprises by weight about 35% PbO, about 36% $B_2O_3$, about 28% ZnO and about 1% CuO.

The powdered ceramics useful for the purposes of this invention may be any well-known ceramic material generally having a particle size of less than about five microns and preferably less than about one micron. Examples of such ceramics include the various zirconium silicates such as $ZrSiO_4$, $BaZrSiO_4$, $MgZrSiO_4$, and $ZnZrSiO_4$, as well as such oxides as $SiO_2$, $Al_2O_3$, and $TiO_2$, and the various conventional crystallized glasses, particularly of the lithia-alumina-silicate type, and mixture of these ceramics. Particularly preferred for the purposes of this invention is zircon ($ZrSiO_4$).

The glass binder together with the requisite amount of powdered ceramic generally comprise the compositions of this invention. It is also contemplated, however, to add other ingredients to the compositions in order to effect certain desired results. For example, various oxides or other additives may be added either to the glass binder itself or to the composition as a whole to render the composition more printable, give it a lower firing temperature, adjust its coefficient of thermal expansion and the like. Such other oxides and additives are conventional and known for their intended purpose and are thus considered a part of this invention. In the most preferred form of this invention, however, and when the compositions are used to form solder stops over conductors, such as Pd-Au conductors previously fired upon substrates of alumina, no additives other than the powdered ceramic are necessary, and thus the glass compositions consist of those ingredients within the preferred ranges listed hereinabove.

The amount of powdered ceramic used to prevent any substantial amount of flow of the glass binder during firing, refiring, or other subsequent high temperature exposures experienced during assembly manufacture will, of course, depend upon many factors such as the temperatures to be experienced, the flow properties of the glass binder itself, the limits of flow tolerable for a given component within a particular microelectronic assembly and the like. Thus, the amount of powdered ceramic actually used in a particular situation will vary over a wide range. Functionally speaking, however, the upper limit of the amount of ceramic employed is usually governed by the fact that the ceramic tends to add porosity to the system and/or raise its firing temperature. Thus, the amount of ceramic added should not be so great as to raise the firing temperature above tolerable limits, usually about 800° C., nor to cause too much porosity so as to destroy the effectiveness of the fired component for its intended purposes. Generally speaking, and especially when using the above-described preferred glass binders in combination with zircon as the powdered ceramic to form solder stops of about 1 mil in thickness, the compositions of this invention should comprise about 60–90% by weight glass binder and about 10–40% by weight powdered ceramic. A particularly preferred composition consists essentially of about 75% by weight of glass binder and about 25% by weight of ceramic.

The above-described compositions are readily formed into printing pastes by admixing them with an organic vehicle which will burn off when the printed pastes are fired. Generally speaking, an effective paste can be formulated by dry blending particles of the glass binder and ceramic powder and thereafter admixing the dry blend with sufficient vehicle to form a printable paste. For good paste formation, the glass binder should be fritted and ground to an average particle size of about 1–10 microns while the ceramic should have a particle size, as stated, of less than about 5 microns. The vehicle is usually employed in an amount of about 20–70% by weight of the paste and preferably about 25% by weight of the paste, the remainder being the dry blend.

Any of the conventional organic vehicles well-known in the printing art may be used in the practice of this invention. For example, pine oil is one preferred vehicle found useful herein. Another example of a preferred vehicle consists of a mixture of butyl Carbitol acetate (trademark of Union Carbide Corp. for diethylene glycol, monobutyl ether acetate) and isoamyl salicylate, preferably in a ratio by weight of 2:1, preferably with a thickener such as ethyl cellulose. An especially preferred organic vehicle for the purposes of this invention consists of 95 percent by weight of a 2:1 weight ratio of butyl Carbitol acetate and iso-amyl salicylate and 5 percent by weight of ethyl cellulose (e.g. N–200).

The pastes formulated in accordance with this invention are readily printable using any conventional technique. Once printed in the desired design, the non-flowable pastes are fired usually at temperatures less than about 800° C. and preferably between about 600–780° C. The structure so formed after firing consists of the glass binder (either in vitreous or, when using the preferred compositions recited above, partially crystallized form) as a continuous phase and of the powdered ceramic material as a dispersed particulate phase. While a portion of each particle of the ceramic, in certain instances, may dissolve in the glass binder, the powdered ceramic in all instances is maintained as a substantial particulate discontinuous phase within the glass binder. It is believed that such a phenomenon is at least partially responsible for the ability of the ceramic to retard the flow characteristics of the glass binder.

In carrying out the firing cycle, any conventional technique may be employed, the particular one chosen being adapted for the particular use to which the paste is put. For the purposes of this invention and when the pastes are fired so as to form solder stops on preselected areas of conductors bonded to a substrate, a preferred firing cycle conducted in air includes (1) a drying period of about 8–15 minutes at 100°–125° C., (2) a heat up period of 8–12 minutes, (3) about 3–12 minutes at the firing temperature, and (4) a cool down period of about 8–12 minutes.

As described hereinabove, the glass components so formed are substantially non-flowable in that they maintain their dimensions during firing, during multiple refirings occurring, for example, when other components are added to the assembly or during any other subsequent high temperature exposure steps in the manufacture of the assembly. The following example illustrates a preferred technique and use of the above teachings:

6.6 gms. of $ZrSiO_4$ (sold by National Lead Company under the trademark Excelopax) are dry blended with 18.75 gms. of a fritted glass consisting of by weight 34.8% PbO, 36.2% $B_2O_3$, 28.0% ZnO and 1.0% CuO. The particle size of the zircon was less than 1 micron while the particle size of the fritted glass was about 5 microns. The dry blended mixture was then thoroughly mixed with 8.45 gms. of pine oil to form a printing paste.

The paste so formed was screen-printed onto a 96% alumina substrate having a coefficient of thermal expansion of about $79\times10^{-7}$ in./in./° C. which had previously been provided with a printed and fired Pd-Au conductor.

The Pd-Au conductor was fired at a temperature of about 870° C. in accordance with conventional techniques.

The paste having been screen-printed over the conductor thus provided a mask over the conductor and left only precise areas on the substrate available for soldering. The paste was applied in a single coat using a 165 mesh screen. The coating was dried at 100° C. for ten minutes and then fired at 770° C. using 10 minute heat up and cool down periods with a peak hold of five minutes. The resulting coating was about 1 mil thick and was partially crystallized. During the initial firing and three subsequent refirings, the glass coating exhibited no substantial amount of flow and thus maintained the unmasked areas for soldering. In addition, the coating formed a strong bond both with the alumina substrate and with the printed conductor.

A similar test was conducted using the same technique described above with the exception that no zircon was added to the fritted glass. During the initial firing at 770° C. and subsequent refirings, the glass component flowed to such an extent as to be inoperative for use as a solder stop, thus illustrating the effectiveness of the compositions of this invention.

Once given the above disclosure, many other features, modifications and improvements will become apparent to those skilled in the art, and such other features, modifications and improvements are therefore intended to be a part of this invention, the scope of which is to be determined by the following claims.

I claim:

1. A solder-stop composition which does not exhibit any substantial amount of flow during firing in a firing temperature range of about 600°–780° C., said solder-stop being substantially non-porous and consisting essentially of about 60–90% by weight of a particulate glass having a firing temperature of less than about 750° C. and about 10–40% by weight of a powdered ceramic material, said powdered ceramic material having an average particle size of less than about 5 microns, said particulate glass comprising by weight about: 30–40% PbO, 30–40% $B_2O_3$, 25–30% ZnO and 0–5% CuO, and said ceramic material being at least one member of the group consisting of $ZrSiO_4$, $BaZrSiO_4$, $MgZrSiO_4$, $ZnZrSiO_4$, $SiO_2$, $Al_2O_3$ and $TiO_2$.

2. A solder-stop composition according to claim 1 wherein the solder-stop composition consists essentially of about 75 weight percent of said particulate glass and about 25 weight percent of said ceramic material.

3. A solder-stop composition according to claim 1 wherein said particulate glass consists essentially of about: 35 weight percent PbO, 36 weight percent $B_2O_3$, 28 weight percent ZnO and 1 weight percent CuO.

4. A solder-stop composition according to claim 1 wherein said powdered ceramic is $ZrSiO_4$.

5. A solder-stop composition according to claim 4 wherein said $ZrSiO_4$ has an average particle size of less than about 1 micron.

References Cited

UNITED STATES PATENTS

| | | | |
|---|---|---|---|
| 3,540,894 | 11/1970 | McIntosh | 106—39 R |
| 3,088,833 | 5/1963 | Pirooz | 106—53 |
| 3,258,350 | 6/1966 | Martin et al. | 106—47 |
| 2,956,219 | 10/1960 | Cianchi | 317—258 |
| 3,293,077 | 12/1966 | Kaiser et al. | 106—39 R |
| 2,889,952 | 6/1959 | Claypoole | 106—53 |
| 2,966,719 | 1/1961 | Park | 106—39 R |
| 2,803,554 | 9/1957 | Fenity et al. | 106—39 R |

OTHER REFERENCES

Hoogendoorn, et al.: Infrared Absorbing Sealing Glasses, in Amer. Cer. Soc. Bull., 48, pp. 1125–7 (1969).

JAMES E. POER, Primary Examiner

W. R. SATTERFIELD, Assistant Examiner

U.S. Cl. X.R.

29—490, 569; 65—43; 106—49, 53; 252—63.5; 317—258